United States Patent
Wang

(10) Patent No.: US 12,453,169 B2
(45) Date of Patent: Oct. 21, 2025

(54) METHOD FOR MANUFACTURING SEMICONDUCTOR DEVICE AND SEMICONDUCTOR DEVICE

(71) Applicant: CHANGXIN MEMORY TECHNOLOGIES, INC., Hefei (CN)

(72) Inventor: Jianping Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 703 days.

(21) Appl. No.: 17/846,131

(22) Filed: Jun. 22, 2022

(65) Prior Publication Data

US 2023/0299074 A1  Sep. 21, 2023

Related U.S. Application Data

(63) Continuation of application No. PCT/CN2022/084584, filed on Mar. 31, 2022.

(30) Foreign Application Priority Data

Mar. 15, 2022  (CN) .......................... 202210254166.0

(51) Int. Cl.
*H10D 84/80* (2025.01)
*H01L 21/311* (2006.01)
(Continued)

(52) U.S. Cl.
CPC ...... *H10D 84/811* (2025.01); *H01L 21/31144* (2013.01); *H01L 21/32139* (2013.01); *H10D 1/474* (2025.01); *H10D 64/667* (2025.01)

(58) Field of Classification Search
CPC ...... H10D 84/811; H10D 84/817; H10D 1/40; H10D 1/474
See application file for complete search history.

(56) References Cited

U.S. PATENT DOCUMENTS 8,907,395 B2  12/2014  Hsu
9,093,559 B2  7/2015  Ng
(Continued)

FOREIGN PATENT DOCUMENTS

CN  1577792 A  2/2005
CN  102956560 A  3/2013
(Continued)

*Primary Examiner* — Jose R Diaz
(74) *Attorney, Agent, or Firm* — SYNCODA LLC; Feng Ma

(57) ABSTRACT

A method for manufacturing a semiconductor device and a semiconductor device are provided. The method includes: providing a substrate including a first area and a second area; forming a stacked material layer on the substrate, where the stacked material layer includes a first dielectric layer, a first conductive layer, and a second conductive layer; performing a first etching process on the stacked material layer to remove the second conductive layer that is located on two end portions of the first area and a middle portion of the second area, so as to form a second gate layer and a resistor contact; and performing a second etching process on the stacked material layer to remain the first conductive layer located under the second gate layer and the resistor contact and the first conductive layer located on the middle portion of the second area.

10 Claims, 11 Drawing Sheets

(51) Int. Cl.
*H01L 21/3213* (2006.01)
*H10D 1/47* (2025.01)
*H10D 64/66* (2025.01)

(56) References Cited

U.S. PATENT DOCUMENTS

| | | |
|---|---|---|
| 9,478,636 B2 | 10/2016 | Chen |
| 10,340,220 B2 | 7/2019 | Lee |
| 2005/0009332 A1 | 1/2005 | Lee |
| 2007/0114591 A1 | 5/2007 | Lee |
| 2007/0117327 A1 | 5/2007 | Lee |
| 2009/0090977 A1* | 4/2009 | Freeman .......... H01L 21/28088 |
| | | 438/383 |
| 2013/0043522 A1 | 2/2013 | Hsu |
| 2013/0146989 A1 | 6/2013 | Hong |
| 2013/0234254 A1 | 9/2013 | Ng |
| 2013/0285151 A1 | 10/2013 | Wu |
| 2013/0341731 A1* | 12/2013 | Chen ....................... H10D 1/47 |
| | | 257/379 |
| 2015/0024562 A1 | 1/2015 | Hsu et al. |
| 2015/0214115 A1 | 7/2015 | Wu et al. |
| 2015/0332962 A1 | 11/2015 | Chen et al. |
| 2017/0040259 A1 | 2/2017 | Chen et al. |
| 2019/0006279 A1 | 1/2019 | Lee et al. |

FOREIGN PATENT DOCUMENTS

| | | |
|---|---|---|
| CN | 103311185 A | 9/2013 |
| CN | 103378099 A | 10/2013 |
| CN | 105097470 A | 11/2015 |
| CN | 103165601 B | 12/2015 |
| CN | 107924948 A | 4/2018 |

\* cited by examiner

METHOD FOR MANUFACTURING SEMICONDUCTOR DEVICE AND SEMICONDUCTOR DEVICE

CROSS-REFERENCE TO RELATED APPLICATIONS

The present application is a U.S. continuation application of International Application No. PCT/CN2022/084584, filed on Mar. 31, 2022, which claims priority to Chinese Patent Application No. 202210254166.0, filed on Mar. 15, 2022. International Application No. PCT/CN2022/084584 and Chinese Patent Application No. 202210254166.0 are incorporated herein by reference in their entireties.

BACKGROUND

In a semiconductor device, a gate structure and a resistor structure are very important components. In a conventional process, different processes are required to be used for a plurality of times to respectively form the gate structure and the resistor structure, resulting in complex processes. Therefore, the process for manufacturing the gate structure need to be optimized.

SUMMARY

The disclosure relates to the field of semiconductor manufacturing, and in particular, to a method for manufacturing a semiconductor device and a semiconductor device.

An embodiment of the disclosure provides a method for manufacturing a semiconductor device. The method includes the following operations.

A substrate is provided. The substrate includes a first area and a second area.

A stacked material layer is formed on the substrate. The stacked material layer includes a first dielectric layer, a first conductive layer, and a second conductive layer from bottom to top.

A first etching process is performed on the stacked material layer to remove the second conductive layer that is located on two end portions of the first area and a middle portion of the second area, so as to expose the first conductive layer from the two end portions of the first area and the middle portion of the second area. The second conductive layer remained on a middle portion of the first area forms a second gate layer, and the second conductive layer remained on two end portions of the second area forms a resistor contact.

A second etching process is performed on the stacked material layer to remain the first conductive layer located under the second gate layer and the resistor contact and the first conductive layer located on the middle portion of the second area. The first conductive layer remained under the second gate layer forms a first gate layer, the first conductive layer remained on the middle portion of the second area and the first conductive layer remained under the resistor contact form a resistor layer, and the resistor layer and the resistor contact form a resistor structure.

A further embodiment of the disclosure provides a semiconductor device. The semiconductor device includes a substrate, a first dielectric layer, a first gate layer, a second gate layer, and a resistor structure.

The substrate includes a first area and a second area.

The first dielectric layer is located on the substrate.

The first gate layer is located on the first dielectric layer of the first area, and the second gate layer is located on the first gate layer.

The resistor structure is located on the first dielectric layer of the second area and includes a resistor layer and a resistor contact. The resistor contact is located above the resistor layer and arranged on two ends of the resistor layer. A bottom surface of the resistor contact is in contact with upper surfaces of two end portions of the resistor layer.

A material of the first gate layer is the same as that of the resistor layer. A material of the second gate layer is the same as that of the resistor contact.

The details of one or more embodiments of the disclosure are set forth in the drawings and the description below. Other features and advantages of the disclosure will be apparent from the specification, the drawings and the claims.

BRIEF DESCRIPTION OF THE DRAWINGS

In order to more clearly illustrate the technical solutions in the embodiments of the disclosure, the drawings used in the description of the embodiments will be briefly described below. It is apparent that the drawings in the following descriptions are merely some embodiments of the disclosure. Other drawings can be obtained by a person skilled in the art according to these drawings without any creative work.

DETAILED DESCRIPTION

Figure 1:
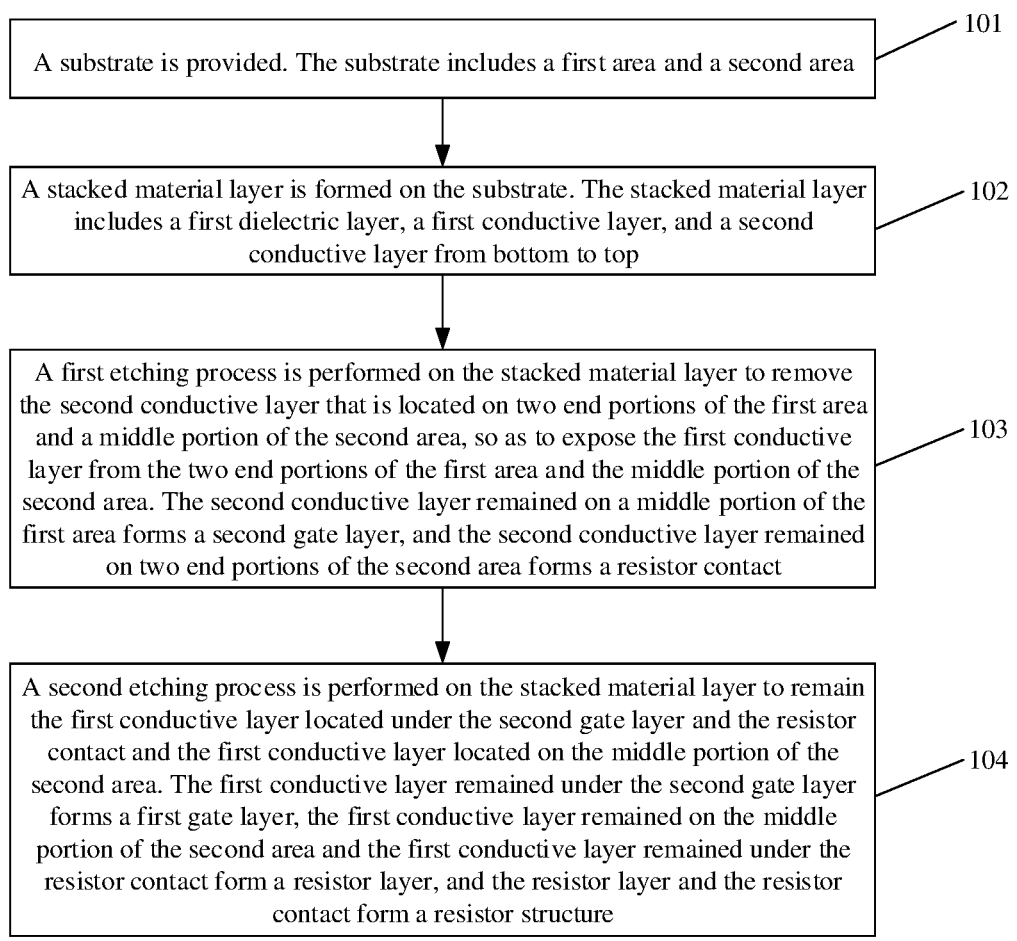
FIG. 1 is a flowchart of a method for manufacturing a semiconductor device according to an embodiment of the disclosure.

Exemplary embodiments disclosed in the disclosure are described in more detail with reference to drawings. Although the exemplary embodiments of the disclosure are shown in the drawings, it should be understood that the disclosure may be implemented in various forms and should not be limited by the specific embodiments described here. On the contrary, these embodiments are provided for more fully understanding of the disclosure, and to completely convey a scope disclosed by the disclosure to a person skilled in the art.

In the following descriptions, a lot of specific details are given in order to provide the more fully understanding of the disclosure. However, it is apparent to a person skilled in the art that the disclosure may be implemented without one or more of these details. In other examples, in order to avoid confusion with the disclosure, some technical features well-known in the field are not described. Namely, not all of the features of an actual embodiments are described here, and well-known functions and structures are not described in detail.

In the drawings, the sizes of a layer, a region, and an element and their relative sizes may be magnified for clarity. The same reference sign represents the same element throughout.

It should be understood that while the element or the layer is referred to as being "on . . . ", "adjacent to . . . ", "connected to . . . " or "coupled to . . . " other elements or layers, it may be directly on the other elements or layers, adjacent to, connected or coupled to the other elements or layers, or an intermediate element or layer may be present. In contrast, while the element is referred to as being "directly on . . . ", "directly adjacent to . . . ", "directly connected to . . . " or "directly coupled to . . . " other elements or layers, the intermediate element or layer is not present. It should be understood that although terms first, second, third and the like may be used to describe various elements, components, regions, layers and/or sections, these elements, components, regions, layers and/or sections should not be limited by these terms. These terms are only used to distinguish one element, component, region, layer or section from another element, component, region, layer or section. Therefore, without departing from the teaching of the disclosure, a first element, component, region, layer or section discussed below may be represented as a second element, component, region, layer or section. While the second element, component, region, layer or section is discussed, it does not mean that the first element, component, region, layer or section is necessarily present in the disclosure.

Spatial relation terms, such as "under . . . ", "below . . . ", "lower", "underneath . . . " "above . . . ", "upper" and the like, may be used here for conveniently describing a relationship between one element or feature shown in the drawings and other elements or features. It should be understood that in addition to orientations shown in the drawings, the spatial relation terms are intended to further include the different orientations of a device in use and operation. For example, if the device in the drawings is turned over, then the elements or the features described as "below" or "underneath" or "under" other elements may be oriented "on" the other elements or features. Therefore, the exemplary terms "below . . . " and "under . . . " may include two orientations of up and down. The device may be otherwise oriented (rotated by 90 degrees or other orientations) and the spatial relation terms used here are interpreted accordingly.

The terms used here are only intended to describe the specific embodiments and are not limitations to the disclosure. As used here, singular forms of "a", "an" and "said/the" are also intended to include plural forms, unless otherwise clearly indicated in the context. It should also be understood that terms "composing" and/or "including", while used in the description, demonstrate the presence of the described features, integers, steps, operations, elements and/or components, but do not exclude the presence or addition of one or more other features, integers, steps, operations, elements, components, and/or groups. As used herein, a term "and/or" includes any and all combinations of related items listed.

In a semiconductor device, a gate structure and a resistor structure are very important structures. In most gate structures, the components of the gate structures include polysilicon layers. However, the polysilicon layers have lower resistivity, which is not suitable for a main body of a resistor. Generally, in order to obtain a resistor structure having a higher resistance value, the main body of the resistor may be obtained by re-forming the polysilicon layer and performing a doping process on the polysilicon layer.

Therefore, in a conventional process, the gate structure and the resistor structure are generally formed by different processes, which increases the complexity of the process and is not conducive to the improvement of production efficiency.

Based on this, the following technical solutions of the embodiments of the disclosure are provided.

An embodiment of the disclosure provides a method for manufacturing a semiconductor device. FIG. 1 is referred to for details. As shown in the figure, the method includes the following steps.

At 101, a substrate is provided. The substrate includes a first area and a second area.

At 102, a stacked material layer is formed on the substrate. The stacked material layer includes a first dielectric layer, a first conductive layer, and a second conductive layer from bottom to top.

At 103, a first etching process is performed on the stacked material layer to remove the second conductive layer that is located on two end portions of the first area and a middle portion of the second area, so as to expose the first conductive layer from the two end portions of the first area and the middle portion of the second area. The second conductive layer remained on a middle portion of the first area forms a second gate layer, and the second conductive layer remained on two end portions of the second area forms a resistor contact.

At 104, a second etching process is performed on the stacked material layer to remain the first conductive layer located under the second gate layer and the resistor contact and the first conductive layer located on the middle portion of the second area. The first conductive layer remained under the second gate layer forms a first gate layer, the first conductive layer remained on the middle portion of the second area and the first conductive layer remained under the resistor contact form a resistor layer, and the resistor layer and the resistor contact form a resistor structure.

In the embodiment of the disclosure, after the stacked material layer is formed, the etching processes are performed on the stacked material layer. The second gate layer and the resistor contact are formed by using the first etching process, and the first gate layer and the resistor layer are formed by using the second etching process. The first gate layer and the second gate layer may be used as gates of the semiconductor device. The resistor contact and the resistor layer together form the resistor structure. In this way, a gate structure and the resistor structure may be simultaneously formed by means of two etching processes, so that a process for forming the gate structure is compatible with a process for forming the resistor structure. Therefore, a process flow of forming the gate structure and the resistor structure is simplified. Therefore, in the embodiment of the disclosure, the process for forming the gate structure is compatible with the process for forming the resistor structure, and a production process flow may be effectively simplified, thereby significantly enhancing production efficiency.

In order to make the above purposes, features and advantages of the disclosure more apparent and easy to be understood, specific implementations of the disclosure are described below in detail with reference to the drawings. For ease of description, a schematic diagram may be partially enlarged not to scale during describing the embodiments of the disclosure in detail. The schematic diagram is only illustrative, and should not limit a scope of protection of the disclosure herein.

FIG. 2 to FIG. 11 are process flow diagrams during manufacturing a semiconductor device according to an embodiment of the disclosure.

Figure 2:
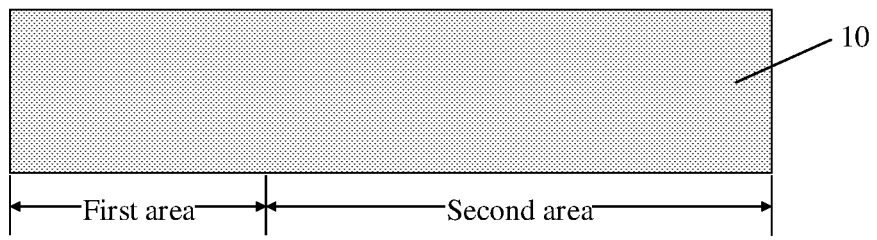
FIG. 2 to FIG. 11 are process flow diagrams during manufacturing a semiconductor device according to an embodiment of the disclosure.

First, step 101 is performed. As shown in FIG. 2, the substrate 10 is provided. The substrate 10 includes a first area and a second area.

The substrate may be a semiconductor substrate, and specifically includes at least one elementary semiconductor material (for example, a Silicon (Si) substrate, or a Germanium (Ge) substrate), at least one III-V compound semiconductor material (for example, a Gallium Nitride (GaN) substrate, a Gallium Arsenide (GaAs) substrate, or an Indium Phosphide (InP) substrate), at least one II-VI compound semiconductor material, at least one organic semiconductor material, or other semiconductor materials known in the art. In a specific embodiment, the substrate is the Si substrate.

Figure 4:
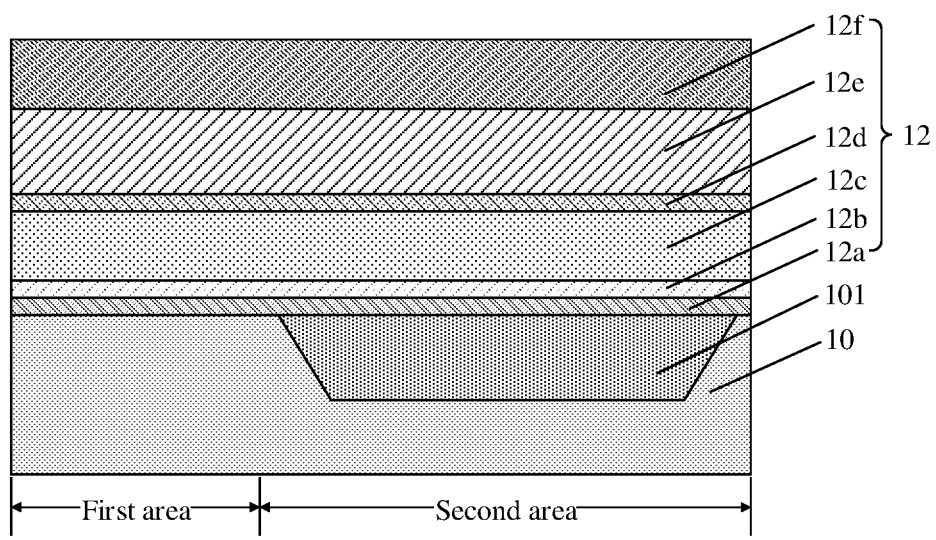

Next, step 102 is performed. As shown in FIG. 4, the stacked material layer 12 is formed on the substrate 10. The stacked material layer 12 includes a first dielectric layer 12a, a first conductive layer 12b, and a second conductive layer 12c from bottom to top.

Herein, a material of the first dielectric layer 12a includes, but is not limited to, oxide, nitride, metal oxide, and oxynitride. Optionally, in some embodiments, the material of the first dielectric layer 12a includes a high K dielectric material. The high K dielectric material may include the element of hafnium. Specifically, the high K dielectric material may include, but not limited to, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), hafnium silicon oxynitride (HfSiON), hafnium zirconate ($HfZrO_4$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$) and/or praseodymium oxide ($Pr_2O_3$), etc.

In some embodiments, a thickness of the first conductive layer 12b ranges from 1 nm to 10 nm, for example, 2 nm, 2.5 nm, 4 nm, 6 nm, or 8 nm, etc.

In some specific embodiments, a material of the first conductive layer 12b includes transition metal nitrides, for example, titanium nitride. But the material is not limited thereto, the first conductive layer 12b may further include, but not limited to, Titanium (Ti), Tantalum (Ta), Titanium Aluminide (TiAl), Tantalum Carbide (TaC), and Tantalum Nitride (TaN). A material of the second conductive layer 12c includes, but is not limited to, polysilicon, etc.

Continuously referring to FIG. 4, it is shown that the stacked material layer 12 further includes a third conductive layer 12e. The third conductive layer 12e is located on the second conductive layer 12c. Performing the first etching process on the stacked material layer 12 further includes: removing the third conductive layer 12e located on the two end portions of the first area and the middle portion of the second area. Herein, a material of the third conductive layer includes, but is not limited to, tungsten.

In some embodiments, the stacked material layer 12 further includes a buffer conductive layer 12d. The buffer conductive layer 12d is located between the second conductive layer 12c and the third conductive layer 12e. Performing the first etching process on the stacked material layer further includes: removing the buffer conductive layer located on the two end portions of the first area and the middle portion of the second area.

Herein, the buffer conductive layer 12d may be used as an anti-diffusion barrier layer, to prevent the material of the third conductive layer 12e from diffusing to an area where the second conductive layer 12c is located. In some embodiments, the material of the buffer conductive layer 12d includes, but is not limited to, Titanium Silicon Nitride (TiSiN), etc.

Optionally, the stacked material layer 12 further includes a capping layer 12f. A material of the capping layer 12f includes, but is not limited to silicon nitride, etc.

In an actual process, the first dielectric layer 12a, the first conductive layer 12b, the second conductive layer 12c, the buffer conductive layer 12d, the third conductive layer 12e, and the capping layer 12f may be formed by using one or more thin film deposition processes. Specifically, the thin film deposition processes include, but are not limited to, a Chemical Vapor Deposition (CVD) process, a Plasma Enhanced Chemical Vapor Deposition (PECVD) process, an Atomic Layer Deposition (ALD) process, or a combination thereof.

Figure 3:
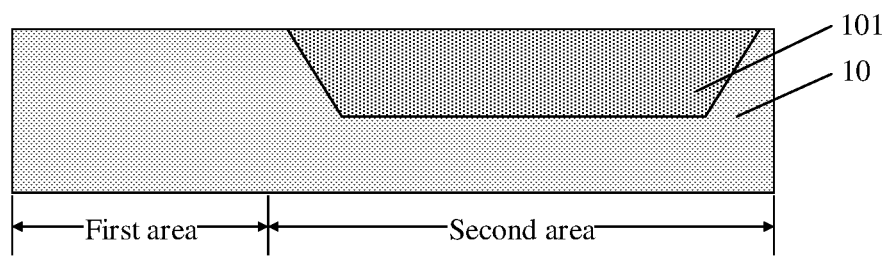

It is to be understood that, as shown in FIG. 3, in some embodiments, before the stacked material layer 12 is formed on the substrate 10, the method further includes: forming a shallow trench isolation structure 101 in the second area of the substrate 10. The resistor structure 14 is located on the shallow trench isolation structure 101.

A material of forming the shallow trench isolation structure 101 includes, but is not limited to, oxide, nitride, and oxynitride, etc.

Figure 5:
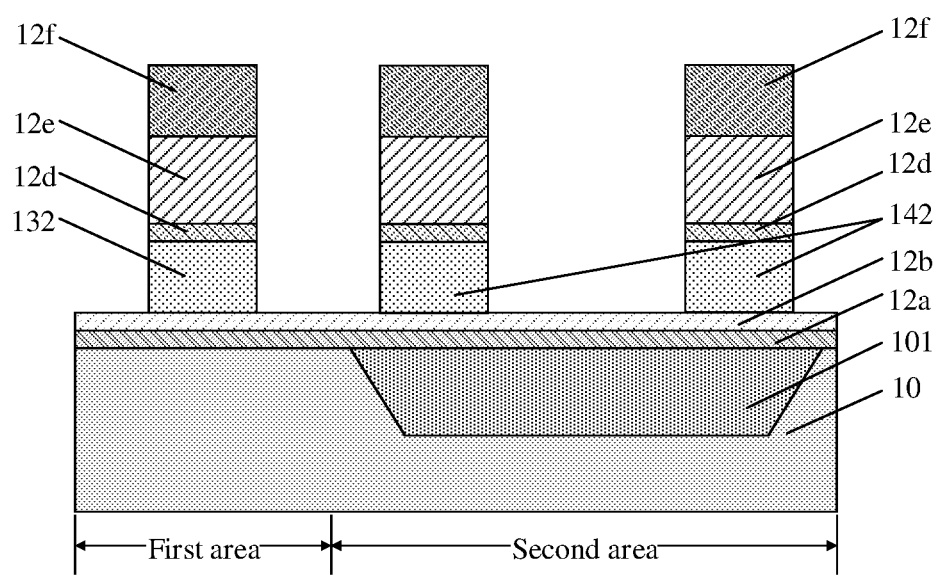

Next, step 103 is performed, as shown in FIG. 5, the first etching process is performed on the stacked material layer 12 to remove the second conductive layer 12c that is located on two end portions of the first area and a middle portion of the second area, so as to expose the first conductive layer 12b from the two end portions of the first area and the middle portion of the second area. The second conductive layer 12c remained on a middle portion of the first area forms a second gate layer 132, and the second conductive layer 12c remained on two end portions of the second area forms a resistor contact 142.

In the actual process, the etching process may be at least one of a dry etching process or a wet etching process or a combination thereof.

Figure 8:
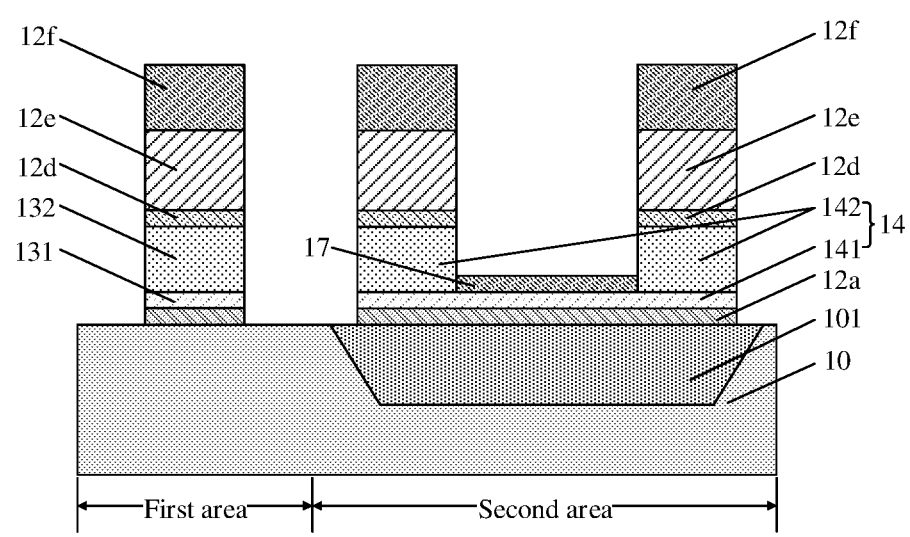

Finally, step 104 is performed, as shown in FIG. 8, the second etching process is performed on the stacked material layer 12 to remain the first conductive layer 12b located under the second gate layer 132 and the resistor contact 142 and the first conductive layer 12b located on the middle portion of the second area. The first conductive layer 12b remained under the second gate layer 132 forms a first gate layer 131. The first conductive layer 12b remained on the middle portion of the second area and the first conductive layer 12b remained under the resistor contact 142 form a resistor layer 141. The resistor layer 141 and the resistor contact 142 form a resistor structure 14.

Herein, the etching process may be at least one of the dry etching process or the wet etching process or a combination thereof.

In the actual process, the first gate layer and the second gate layer may be used as a gate structure of the semiconductor device. The gate structure may be used as a gate of an NMOS structure or a PMOS structure. In different MOS structures, the thickness of the first conductive layer included in the gate structure may be different. Therefore, it is to be understood that, in the embodiment of the disclosure, the resistor structure simultaneously formed with the gate structure may provide a plurality of resistance values for actual selection.

In some specific embodiments, when the material of the resistor layer is titanium nitride, the thickness of the resistor layer simultaneously formed with the gate structure in the NMOS structure is 6 nm, or the thickness of the resistor layer simultaneously formed with the gate structure in the PMOS structure is 2.5 nm. The resistor structure formed by the material with either of the two thicknesses may provide a higher resistance value.

In the embodiment of the disclosure, there is no need to form a material layer used as the resistor layer again. The gate structure and the resistor structure may be simultaneously formed only by means of two etching processes, that is, a process for forming the gate structure is compatible with a process for forming the resistor structure. Therefore, by the manufacturing method provided in the embodiment of the disclosure, processes of forming the gate structure and forming the resistor structure are greatly simplified, thereby enhancing production efficiency.

In addition, since the process for forming the gate structure is compatible with the process for forming the resistor structure, etching accuracy when the resistor structure is formed may be the same as etching accuracy when the gate structure is formed. Therefore, the risk of producing unqualified products due to abnormal etching accuracy may be effectively prevented.

In a conventional technology, a resistor may be formed by doping an active area. However, the resistance value of this type of resistors is largely affected by process fluctuation. Moreover, the factors such as critical dimensions, injection energy, and annealing temperatures all affect the resistance value of the resistor. In addition, the resistor structure is also prone to generate coupling capacitance with a doped well area of the substrate. Since there is a large PN junction capacitance between the resistor structure and the substrate, a PN junction needs to be in a forward biased state when a voltage is applied to the resistor structure, which limits the application of such resistor structures.

In contrast, in the embodiment of the disclosure, the resistor structure has the advantages such as a stable resistance value and a low temperature coefficient, and the resistance value is not prone to vary with temperatures. In addition, since there is substantially no coupling capacitance generated between the resistor structure and the doped well area of the substrate, the voltage applied to the resistor structure may be freely modulated.

Figure 6:
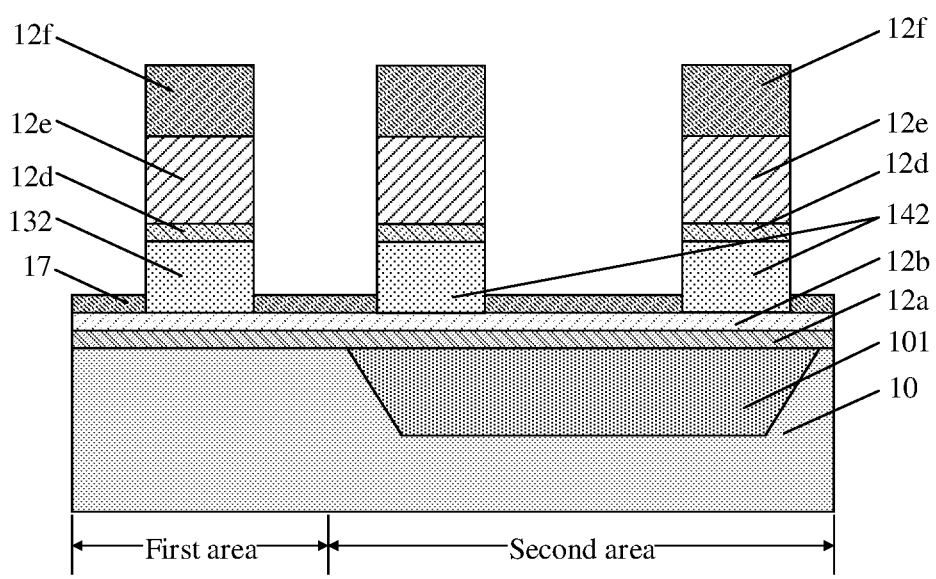
Figure 7:
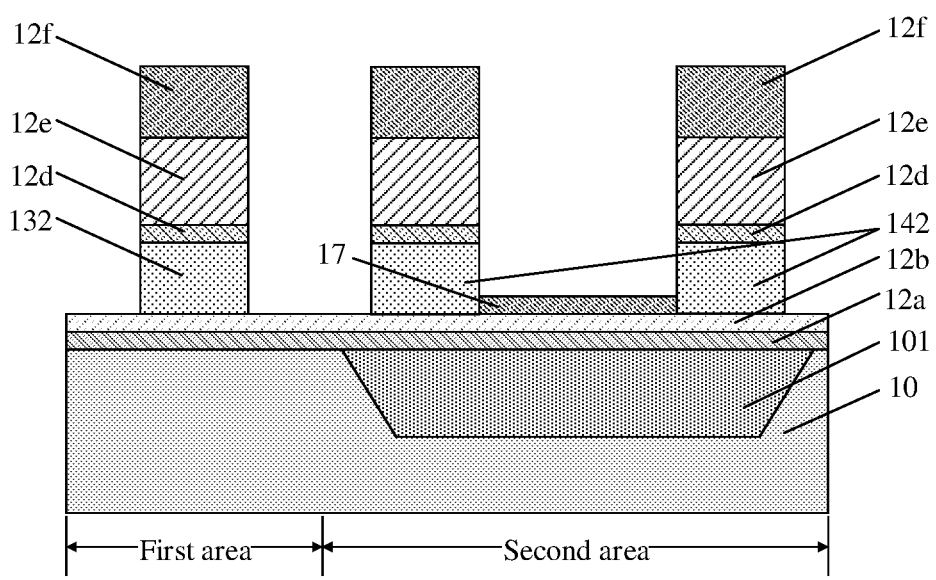

In some embodiments, as shown in FIG. 6 and FIG. 7, before the second etching process is performed on the stacked material layer 12, the method further includes the following operations.

A mask layer 17 is formed on the first conductive layer 12b.

An etching process is performed on the mask layer 17. The mask layer 17 located on the middle portion of the second area is remained, and the mask layer 17 on the first area and the mask layer 17 on other portions than the middle portion of the second area are removed.

A material of the mask layer may include, but not limited to, silicon nitride, etc. A process of forming the mask layer may be the same as a process of forming the first dielectric layer, which is not described herein again.

Figure 9:
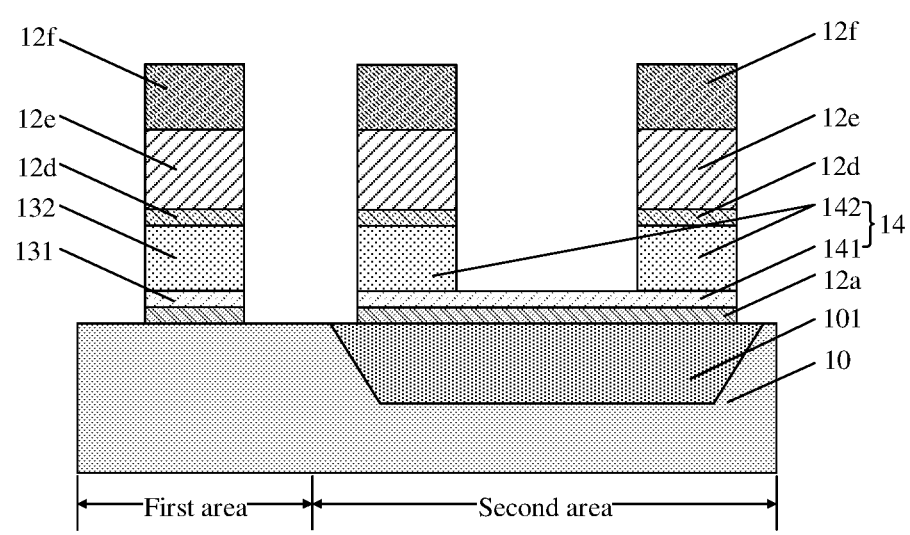

As shown in FIG. 9, after the second etching process is performed on the stacked material layer 12, the method further includes: removing the mask layer 17 located on the second area.

Figure 11:
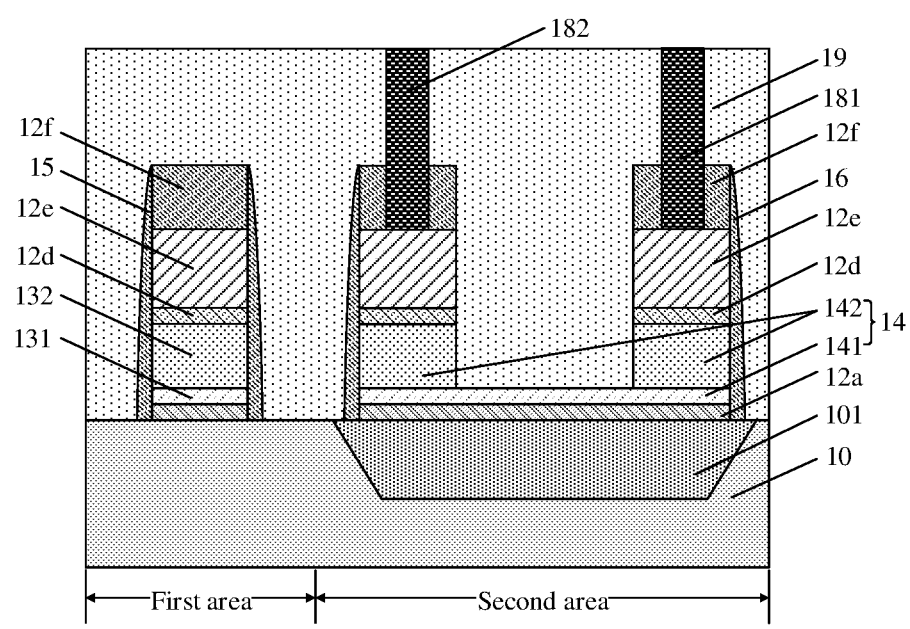

In the actual process, as shown in FIG. 11, after the resistor structure 14 is formed, the method further includes: forming a first contact 181 and a second contact 182 above two ends of the resistor structure 14. Bottoms of the first contact 181 and the second contact 182 may be in contact with an upper surface of the third conductive layer 12e.

In some embodiments, forming the first contact 181 and the second contact 182 includes the following operations.

An insulation material layer 19 is formed on the substrate 10.

The etching process is performed on the insulation material layer 19 to form a first contact hole (not shown) and a second contact hole (not shown). The first contact hole (not shown) and the second contact hole (not shown) are located above two ends of the resistor structure 14, and stop at the upper surface of the third conductive layer 12e.

The first contact 181 and the second contact 182 are respectively formed in the first contact hole (not shown) and the second contact hole (not shown).

In the actual process, a material of forming the insulation material layer 19 includes, but is not limited to, oxide, nitride, and oxynitride, etc.

The materials of forming the first contact 181 and the second contact 182 may be conductive materials. Specifically, the conductive materials may include, but not limited to, tungsten.

Figure 10:
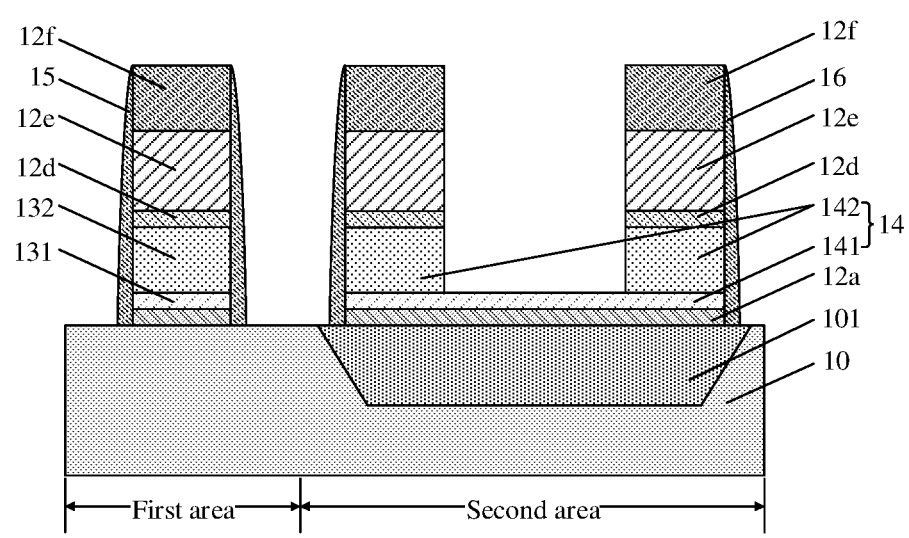

Optionally, as shown in FIG. 10, before the first contact 181 and the second contact 182 are formed, the method further includes the following operations.

A second dielectric layer (not shown) is formed on the substrate 10.

An etching process is performed on the second dielectric layer (not shown), to form first insulation spacers 15 on two sides of the first gate layer 131 and the second gate layer 132, and form second insulation spacers 16 on two sides of the resistor structure.

The first insulation spacers 15 and the second insulation spacers 16 may electrically separate the first gate layer 131, the second gate layer 132 from the resistor structure 14.

Herein, the materials of first insulation spacers 15 and the second insulation spacers 16 may include, but are not limited to, oxide, nitride, and oxynitride, etc.

In the embodiment of the disclosure, the process for forming the gate structure is compatible with the process for forming the resistor structure. Therefore, processes of forming the gate structure and forming the resistor structure are greatly simplified, thereby enhancing production efficiency.

In addition, in the embodiment of the disclosure, the resistor structure has the advantages such as a high and stable resistance value and a low temperature coefficient, and the resistance value is not prone to vary with temperatures. In addition, since there is substantially no coupling capacitance generated between the resistor structure and the doped well area of the substrate, the voltage applied to the resistor structure may be freely modulated.

An embodiment of the disclosure further provides a semiconductor device. As shown in FIG. 11, the semiconductor device includes a substrate 10, a first dielectric layer 12a, a first gate layer 131, a second gate layer 132, and a resistor structure 14.

The substrate 10 includes a first area and a second area.

The first dielectric layer 12a is located on the substrate 10.

The first gate layer 131 is located on the first dielectric layer 12a of the first area, and the second gate layer 132 is located on the first gate layer 131.

The resistor structure 14 is located on the first dielectric layer 12a of the second area and includes a resistor layer 141 and a resistor contact 142. The resistor contact 142 is located above the resistor layer 141 and arranged on two ends of the resistor layer 141. A bottom surface of the resistor contact 142 is in contact with upper surfaces of two end portions of the resistor layer 141.

A material of the first gate layer 131 is the same as that of the resistor layer 141. A material of the second gate layer 132 is the same as that of the resistor contact 142.

Herein, the substrate 10 may be a Si substrate.

In some embodiments, a shallow trench isolation structure 101 is arranged in the second area of the substrate 10. The resistor structure 14 is located on the shallow trench isolation structure 101. A material of forming the shallow trench isolation structure 101 includes, but is not limited to, oxide, nitride, and oxynitride, etc.

In some specific embodiments, a material of the first dielectric layer 12a includes, but is not limited to, oxide, nitride, metal oxide, and oxynitride, etc. Optionally, the material of the first dielectric layer 12a includes a high K dielectric material. The high K dielectric material may include the element of hafnium. Specifically, the high K dielectric material may include, but not limited to, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), hafnium silicon oxynitride (HfSiON), hafnium zirconate ($HfZrO_4$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$) and/or praseodymium oxide ($Pr_2O_3$).

In some embodiments, the first gate layer 131 and the resistor layer 141 have a same material. The second gate layer 132 and the resistor contact 142 have a same material. Specifically, the material of the first gate layer 131 and the resistor layer 141 includes transition metal nitride, for example, titanium nitride etc. But the material is not limited thereto, the first conductive layer 12b may further include, but not limited to, Titanium (Ti), Tantalum (Ta), Titanium Aluminide (TiAl), Tantalum Carbide (TaC), and Tantalum Nitride (TaN). The material of the second gate layer 132 and the resistor contact 142 includes, but is not limited to, polysilicon, etc.

In some specific embodiments, thicknesses of the first gate layer and the resistor layer range from 1 nm to 10 nm, for example, 2 nm, 2.5 nm, 4 nm, 6 nm, or 8 nm, etc.

It is to be understood that, the first gate layer and the second gate layer may be used as a gate structure of the semiconductor device. The gate structure may be used as the gate of the NMOS structure or the PMOS structure. When the material of the resistor layer is the same as the material of the first gate layer in the gate structure included in the NMOS structure, and the material is titanium nitride, the thicknesses of the first gate layer and the resistor layer may be 6 nm. When the material of the resistor layer is the same as the material of the first gate layer in the gate structure included in the PMOS structure, and the material is titanium nitride, the thicknesses of the first gate layer and the resistor layer may be 2.5 nm. The resistor structure formed by the material with either of the two thicknesses may provide a higher resistance value.

In some embodiments, the process for forming the gate structure may be compatible with the process for forming the resistor structure, so that a production process flow may be effectively simplified, thereby significantly enhancing production efficiency.

In some embodiments, the semiconductor device further includes a third conductive layer 12e. The third conductive layer 12e is located on the second gate layer 132 and the resistor contact 142. Herein, a material of the third conductive layer includes, but is not limited to, tungsten, etc.

In some specific embodiments, the semiconductor device further includes a buffer conductive layer 12d. The buffer conductive layer 12d is located between the third conductive layer 12e and the second gate layer 132, and located between the third conductive layer 12e and the resistor contact 142.

It is to be understood that, the buffer conductive layer 12d may be used as an anti-diffusion barrier layer, to prevent the material of the third conductive layer 12e from diffusing to an area where the second conductive layer 12c is located. Herein, the material of the buffer conductive layer 12d includes, but is not limited to, TiSiN, etc.

Optionally, the semiconductor device further includes a capping layer 12f. The capping layer 12f is located on the third conductive layer 12e on the second gate layer 132, and on the third conductive layer 12e on the resistor contact 142. The material of the capping layer 12f includes, but is not limited to, silicon nitride, etc.

Continuously referring to FIG. 11, it is shown that the semiconductor device further includes first insulation spacers 15 and second insulation spacers 16. The first insulation spacers 15 are located on two sides of the first gate layer 131 and the second gate layer 132, and the second insulation spacers 16 are located on two sides of the resistor structure 14.

It is to be understood that, the first insulation spacers 15 and the second insulation spacers 16 may electrically separate the first gate layer 131, the second gate layer 132 from the resistor structure 14.

Herein, the materials of first insulation spacers 15 and the second insulation spacers 16 may include, but are not limited to, oxide, nitride, and oxynitride, etc.

In the actual process, the semiconductor device further includes a first contact 181 and a second contact 182 located above two ends of the resistor structure 14. Bottoms of the first contact 181 and the second contact 182 may be in contact with an upper surface of the third conductive layer 12e. The materials of the first contact 181 and the second contact 182 may be a conductive material. Specifically, the conductive material may include, but is not limited to, tungsten, etc.

In some embodiments, the semiconductor device further includes an insulation material layer 19. The insulation material layer 19 is located on the substrate 10. A top surface of the insulation material layer 19 is flush with top surfaces of the first contact 181 and the second contact 182. In the actual process, a material of forming the insulation material layer 19 includes, but is not limited to, oxide, nitride, and oxynitride, etc.

To sum up, in the embodiment of the disclosure, there is no need to form a material layer used as the resistor layer again. The gate structure and the resistor structure may be simultaneously formed only by means of two etching processes, that is, a process for forming the gate structure is compatible with a process for forming the resistor structure. Therefore, the processes of forming the gate structure and forming the resistor structure are greatly simplified, thereby enhancing production efficiency.

In addition, since the process for forming the gate structure is compatible with the process for forming the resistor structure, etching accuracy when the resistor structure is formed is the same as etching accuracy when the gate structure is formed. Therefore, the risk of producing unqualified products due to abnormal etching accuracy are effectively prevented.

In addition, in the embodiment of the disclosure, the resistor structure has the advantages such as a high and stable resistance value, and the resistance value is not prone to vary with temperatures. In addition, since there is substantially no coupling capacitance generated between the resistor structure and the doped well area of the substrate, the voltage applied to the resistor structure may be freely modulated.

It is to be noted that, the method for manufacturing a semiconductor device provided in the embodiment of the disclosure is applicable to the DRAM structure or other semiconductor devices, which is not limited herein. The embodiments of the method for manufacturing a semiconductor device provided in the disclosure and the embodiments of the semiconductor device belong to the same conception. The technical features in the technical solutions described in the embodiments may be arbitrarily combined without conflict.

The above are only preferred embodiments of the disclosure, and are not intended to limit the scope of protection of the disclosure. Any modifications, equivalent replacements, improvements and the like made within the spirit and principle of the disclosure shall be included within the scope of protection of the disclosure.

INDUSTRIAL APPLICABILITY

In the embodiments of the disclosure, the process for forming the gate structure is compatible with the process for forming the resistor structure, and a production process flow may be effectively simplified, thereby significantly enhancing production efficiency.

The invention claimed is:

1. A method for manufacturing a semiconductor device, comprising:
   providing a substrate comprising a first area and a second area;
   forming a stacked material layer on the substrate, wherein the stacked material layer comprises a first dielectric layer, a first conductive layer, and a second conductive layer from bottom to top;
   performing a first etching process on the stacked material layer to remove the second conductive layer that is located on two end portions of the first area and a middle portion of the second area, so as to expose the first conductive layer from the two end portions of the first area and the middle portion of the second area, wherein the second conductive layer remained on a middle portion of the first area forms a second gate layer, and the second conductive layer remained on two end portions of the second area forms a resistor contact; and
   performing a second etching process on the stacked material layer to remain the first conductive layer located under the second gate layer and the resistor contact and the first conductive layer located on the middle portion of the second area, wherein the first conductive layer remained under the second gate layer forms a first gate layer, the first conductive layer remained on the middle portion of the second area and the first conductive layer remained under the resistor contact form a resistor layer, and the resistor layer and the resistor contact form a resistor structure.

2. The method of claim 1, wherein prior to performing a second etching process on the stacked material layer, the method further comprises:
   forming a mask layer on the first conductive layer; and
   performing an etching process on the mask layer to remain the mask layer located on the middle portion of the second area and remove the mask layer on the first area and the mask layer on other portions than the middle portion of the second area.

3. The method of claim 2, wherein after performing a second etching process on the stacked material layer, the method further comprises: removing the mask layer located on the second area.

4. The method of claim 1, wherein after the resistor structure is formed, the method further comprises: forming a first contact and a second contact above two ends of the resistor structure.

5. The method of claim 4, wherein prior to forming a first contact and a second contact, the method further comprises:
   forming a second dielectric layer on the substrate; and
   performing an etching process on the second dielectric layer, to form first insulation spacers on two sides of the first gate layer and the second gate layer, and form second insulation spacers on two sides of the resistor structure.

6. The method of claim 1, wherein prior to forming a stacked material layer on the substrate, the method further comprises: forming a shallow trench isolation structure in the second area of the substrate, wherein the resistor structure is located on the shallow trench isolation structure.

7. The method of claim 1, wherein a material of the first conductive layer comprises transition metal nitride; and a material of the second conductive layer comprises polysilicon.

8. The method of claim 1, wherein a thickness of the first conductive layer ranges from 1 nm to 10 nm.

9. The method of claim 1, wherein the stacked material layer further comprises a third conductive layer, and the third conductive layer is located on the second conductive layer; and the performing a first etching process on the stacked material layer further comprises: removing the third conductive layer located on the two end portions of the first area and the middle portion of the second area.

10. The method of claim 9, wherein the stacked material layer further comprises a buffer conductive layer, and the buffer conductive layer is located between the second conductive layer and the third conductive layer; and the performing a first etching process on the stacked material layer further comprises: removing the buffer conductive layer located on the two end portions of the first area and the middle portion of the second area.

* * * * *